United States Patent [19]

Nojima et al.

[11] 4,329,655
[45] May 11, 1982

[54] ADAPTIVE EQUALIZATION SYSTEM FOR NONLINEARITIES

[75] Inventors: Toshio Nojima, Yokosuka; Satoshi Ohyama, Yunotani, both of Japan

[73] Assignee: Nippon Telegraph & Telephone Public Corp., Tokyo, Japan

[21] Appl. No.: 117,282

[22] Filed: Jan. 31, 1980

[30] Foreign Application Priority Data

Feb. 13, 1979 [JP] Japan ................................. 54/14358
Dec. 14, 1979 [JP] Japan ................................ 54/161449

[51] Int. Cl.³ ............................................. H03F 1/33
[52] U.S. Cl. .................................... 330/149; 328/163; 333/18
[58] Field of Search .................... 330/43, 52, 149, 151; 328/163; 333/18; 455/50, 276, 304

[56] References Cited

U.S. PATENT DOCUMENTS 4,068,186  1/1978  Sato et al. ............................ 330/151

OTHER PUBLICATIONS

Falconer, "Adaptive Equalization of Channel Non-Linearities in QAM Data Transmission Systems," *The Bell System Technical Journal*, Sep. 1978, pp. 2589–2611.

*Primary Examiner*—James B. Mullins
*Attorney, Agent, or Firm*—Armstrong, Nikaido, Marmelstein & Kubovcik

[57] ABSTRACT

An adaptive equalization system for compensating the nonlinearities generated in a traveling-wave tube amplifier comprises an equalization circuit connected to the traveling-wave tube amplifier. The equalization circuit has a series circuit having a distortion generator for providing a high order distortion, a variable phase shifter and a variable attenuator for controlling the phase and the amplitude of the output of the distortion generator, and a delay line connected parallel to said series circuit so that the delay time in the delay line is equal to the delay time in that series circuit. A distortion detector is provided at the output of the traveling-wave tube amplifier for detecting the residual distortion in the output signal, and a distortion control circuit is provided for adjusting the variable phase shifter and the variable attenuator so that the residual distortion at the output of the traveling-wave tube amplifier becomes minimum.

9 Claims, 16 Drawing Figures

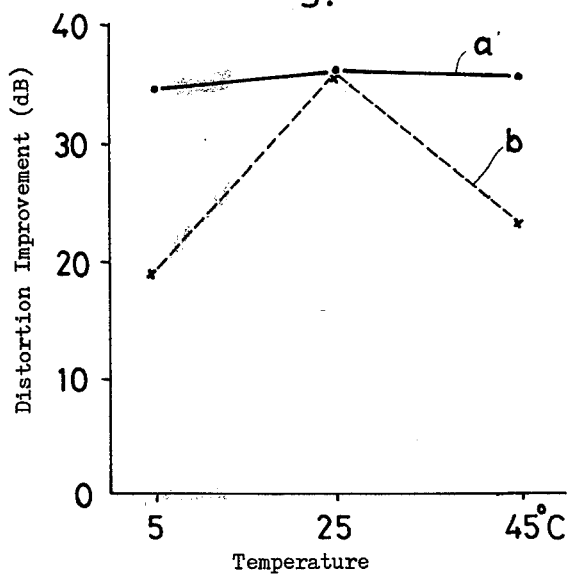
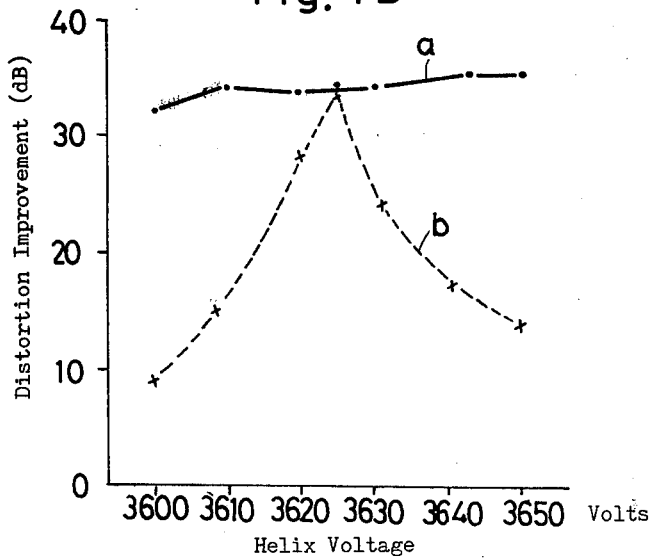

(Id)

4,329,655

ADAPTIVE EQUALIZATION SYSTEM FOR NONLINEARITIES

BACKGROUND OF THE INVENTION

The present invention relates to an adaptive equalization system of nonlinearities in a pre-distortion nonlinearity compensation system and/or a post-distortion nonlinearity compensation system, in particular, it relates to such a system which performs automatically the compensation of the nonlinearities of a circuit.

The present adaptive equalization system is preferably applicable to compensate the nonlinearities of a traveling-wave tube amplifier.

A prior equalization system for the compensation of the nonlinearities for a high frequency region in which a negative feed-back system can not be utilized because of the delay and/or the phase characteristics of the feedback loop, is a pre-distortion system, or a post-distortion system.

However, said prior equalization systems have the disadvantage that the equalization operation is not always complete since the structure and the operation of the equalization system are independent from that of a circuit to be equalized, that is to say, when the characteristics of one of the equalizer and the circuit to be equalized fluctuate due to the change of the ambient temperature or a secular variation, an undesirable residual nonlinearities will be generated.

In order to solve that problem, a system which maintain the gain of a circuit to be equalized constant has been proposed (for instance, Japanese patent laid open publication No. 54-107656). However, that proposal is effective only when the change of the nonlinearities of both the amplitude and the phase are small, and the change of the absolute value of the amplitude is large. Accordingly, when the nonlinearities themselves change, like the case when the power source of a circuit to be equalized changes, said proposal can not be utilized.

Therefore, a prior equalization system must be readjusted frequently to provide the desired characteristics.

SUMMARY OF THE INVENTION

It is an object, therefore, of the present invention to overcome the disadvantages and limitations of a prior equalization system by providing a new and improved equalization system.

Another object of the present invention is to provide an equalization system which operates adaptively so that the residual distortion becomes minimum.

The above and other objects are attained by an adaptive equalization system for nonlinearities having an input terminal receiving an input signal, an output terminal providing an equalized output signal, and a circuit to be equalized inserted between the input terminal and the output terminal; an equalization circuit connected to that circuit to be equalized, having a series circuit with a distortion generator for providing the high order distortion, a variable phase shifter for shifting the phase of the output signal of said distortion generator and a variable attenuator for adjusting the amplitude of the output signal of the distortion generator, and a delay means connected parallel to that series circuit so that the delay time in that delay means is equal to the delay time in said series circuit; a distortion detector connected to the output terminal of the adaptive equalization system for detecting the noise level in the predetermined narrow frequency band; and a distortion control circuit connected to the output of said distortion detector for controlling said variable phase shifter and said variable attenuator so that the distortion detected by said distortion detector becomes minimum.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
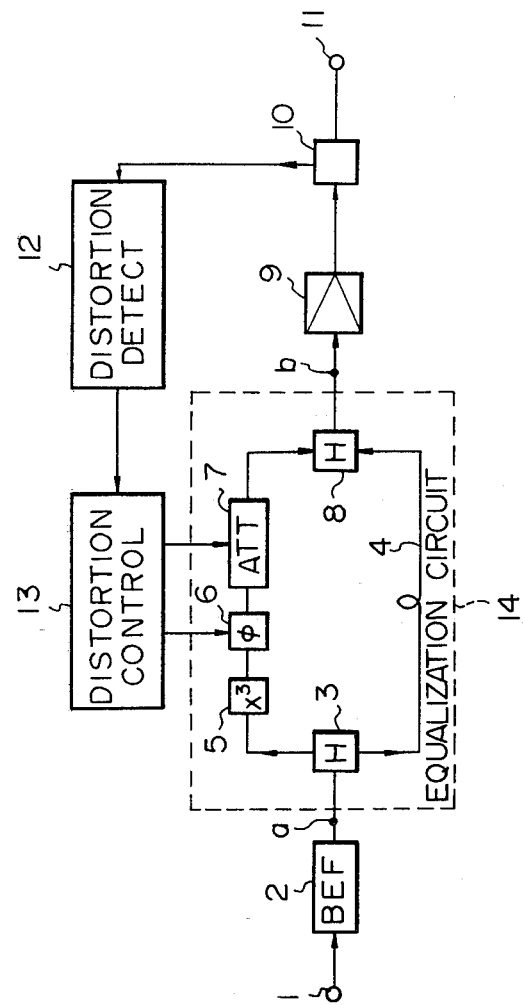
FIG. 1 is the brief block diagram of the embodiment of the adaptive equalization system according to the present invention.
Figures 2, 2A:
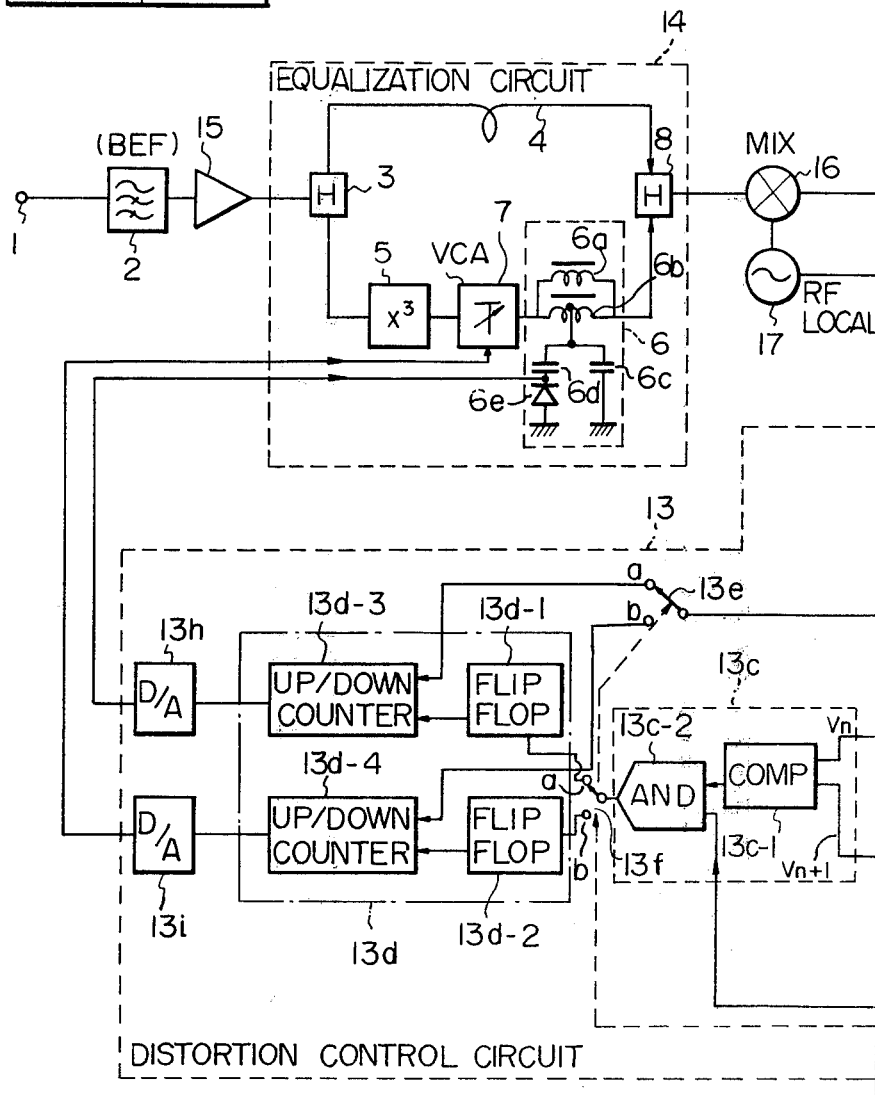
FIGS. 2A and 2B is the detailed block diagram of the embodiment of the adaptive equalization system according to the present invention.

FIG. 1 shows the brief block diagram of the adaptive equalization system for compensating the intermodulation distortion of the third order, and FIG. 2 is the detailed block diagram of the apparatus shown in FIG. 1 when the present apparatus is utilized for the compensation in a traveling-wave tube circuit. In those figures, the reference numeral 1 is an input terminal, 2 is a band-elimination filter, 3 and 10 are a power divider, 8 is a power combiner, 4 is a delay circuit, 5 is a distortion generator which gives the third order distortion to an original signal, 6 is a variable phase shifter, 7 is a variable attenuator, 9 is the circuit to be equalized, 11 is an output terminal, 12 is a distortion detector, 13 is a distortion control circuit. The circuit 14 enclosed by the dotted line having the delay circuit 4, the distortion generator 5, the variable phase shifter 6, the variable attenuator 7, and the power divider 3 and the power combiner 8 compose an equalizer for the circuit 9, and the operation of the circuit 14 is controlled by the distortion detector 12 and the distortion control circuit 13.

The operational principle of the adaptive equalization system in FIG. 1 is as follows.

It has been well known that a multiplexed telephone signal appears like a Gaussian noise when a tone idle system which sends a tone signal when no speech signal is transmitted is utilized. In that case, the spectrum in the whole band is almost flat, and the average level of the multiplexed signal is almost constant. Also, the distortion noise generated in a microwave amplifier distributes almost uniformly in the whole passband, and the spectrum of the multiplexed telephone signal has the narrow gap band or the idle channel where no effective circuit is allocated.

Accordingly, the band-elimination filter 2 in FIG. 1 deletes all the noise component within the predetermined band where no effective circuit is allocated. The output signal of the band-elimination filter 2 is pre-distorted by the equalizer 14, the output of which is applied to the amplifier 9 to be equalized. Of course, the equalizer 14 provides the distortion to the signal so that the distortion given by the equalizer 14 is cancelled by the distortion generated by the circuit 9. The distortion detector 12 connected to the output of the circuit 9 detects the noise level in said narrow gap band where said band-elimination filter deletes all the noise component, and the distortion control circuit 13 connected to the output of the distortion detector 12 controls the equalizer 14 so that the noise component detected by the distortion detector 12 becomes minimum.

Figure 2B:
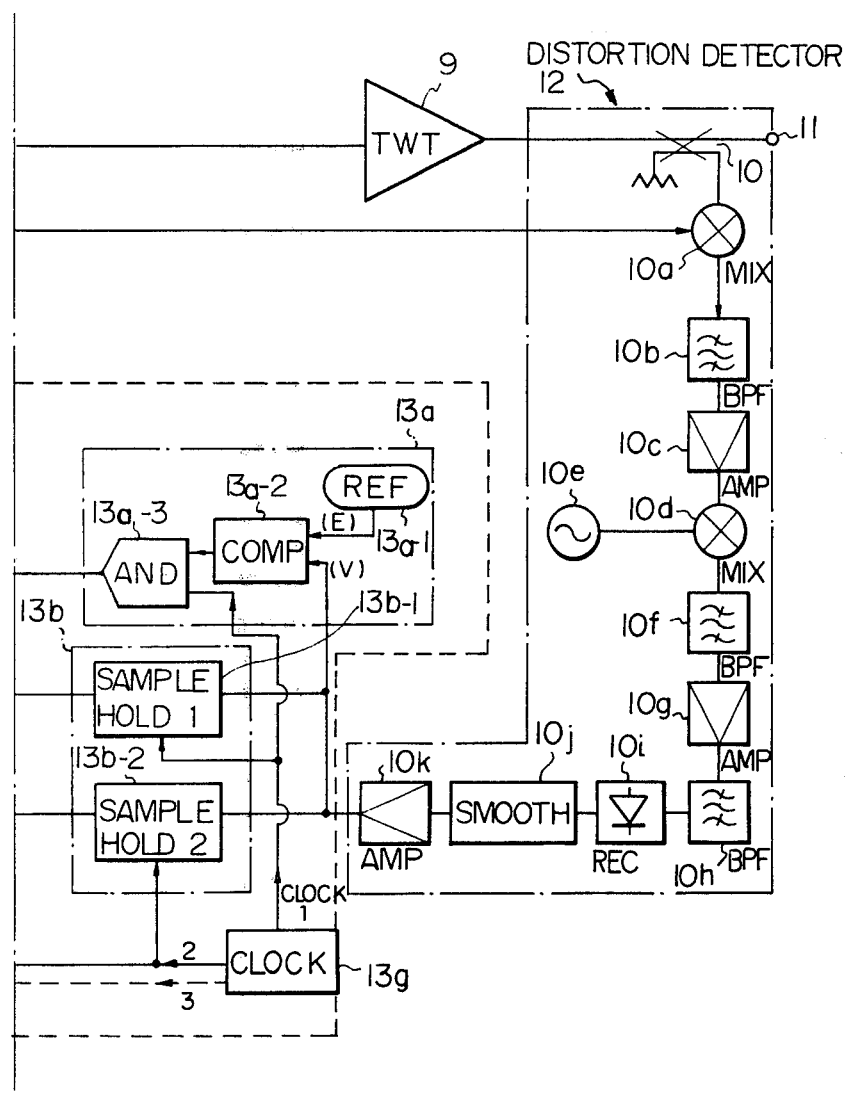

FIG. 2A and 2B show the detailed block diagram of the present equalization system in which the traveling-wave tube amplifier is equalized. In FIG. 2, the same reference numerals as those in FIG. 1 show the same members as those in FIG. 1. The input signal in the IF stage (intermediate frequency stage) at the input terminal 1 is applied to the equalizer 14 through the band-elimination filter 2 and an amplifier 15. The output signal of the equalizer 14 is applied to the frequency mixer 16 which also receives the local frequency from the local oscillator 17, and the frequency mixer converts the IF signal to the microwave frequency signal. The frequency converted signal is applied to the traveling-wave tube amplifier 9 which is the circuit to be equalized. The output of the traveling-wave tube amplifier 9 is applied to the output terminal 11 through the power divider 10, which is implemented for instance by a waveguide directional coupler. The distortion detector 12, the distortion control circuit 13, and the equalization circuit 14 will be described in detail hereinafter.

(a) Distortion detector 12

The distortion detector 12 detects the distortion noise level in the idle channel at the output of the circuit 9, and the distortion detector 12 is coupled with the circuit 9 by the directional coupler 10. It should be noted that all the thermal noise in said idle channel is deleted by the band-elimination filter 2 provided before the equalization circuit 14. The distortion detector 12 converts the microwave frequency to the low frequency in order to conveniently derive the distortion noise in the narrow idle channel. In FIG. 2, the output of the directional coupler 10 is applied to the first frequency mixer 10a which converts the input frequency to the first intermediate frequency utilizing the local frequency from the local oscillator 17. The output of the mixer 10a is then applied to the second frequency mixer 10d through the bandpass filter 10b and the buffer amplifier 10c. The second mixer 10d converts the input frequency to the second intermediate frequency utilizing the second local frequency from the second local oscillator 10e. The output of the second mixer 10d is applied to the rectifier 10i through the bandpass filter 10f, the buffer amplifier 10g and the bandpass filter 10h. The rectified output is applied to the amplifier 10k through the smoother circuit 10j. Thus, the D.C. voltage proportional to the distortion noise level is obtained at the output of the amplifier 10k. The time constant of the smoother circuit 10j is preferably larger than 1.6 seconds so that the output level of the smoother circuit is substantially constant and is not affected by the instantaneous level of the input signal. Statistically, because the average signal level of the multiplexed telephone channel is substantially constant and longer then 1.6 seconds. According to the preferable embodiment, some numerical embodiments are; the frequency at the input terminal 1 is 140 MHz; the bandwidth of the band-elimination filter 2 is 8.8 kHz, the output frequency of the mixer 16 is 6 GHz, the output frequency of the other mixer 10b is 140 MHz, the bandwidth of the bandpass filter 10b is 20 kHz, the output frequency of the other mixer 10d is 10.7 MHz, the bandwidth of the bandpass filter 10f is 3.1 kHz, and the bandwidth of the bandpass filter 10h is 3.1 kHz.

(b) Equalization circuit 14

Figure 3A:
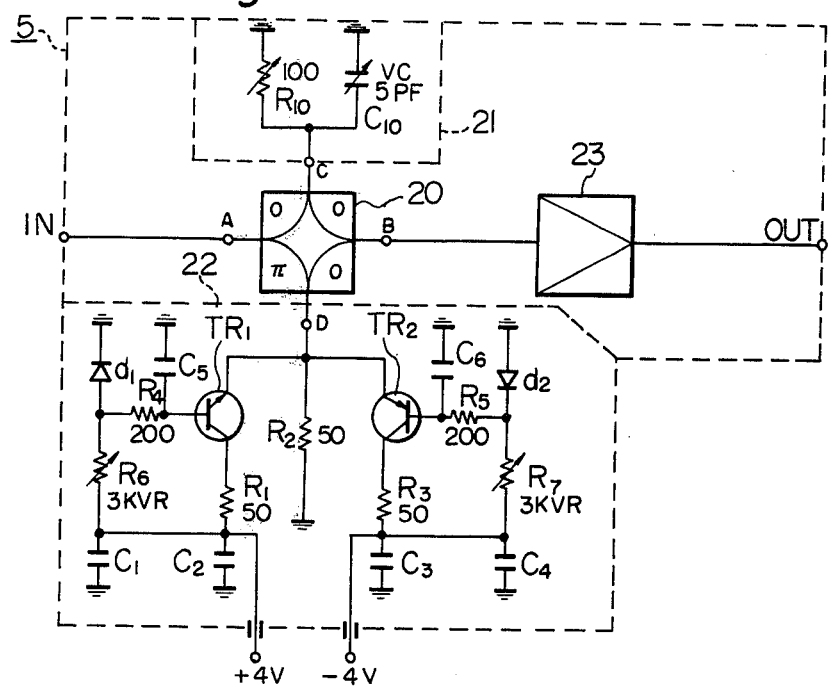
FIG. 3A is the circuit diagram of the 3'rd distortion generator.

The equalization circuit 14 has a series circuit having a distortion generator 5 for providing the third order distortion, the variable phase shifter 6 for shifting the phase of the output signal of the distortion generator 5, and the variable attenuator 7 for adjusting the amplitude of the output signal of the distortion generator. The distortion generator 5 generates the third order distortion according to the input signal of the same, and the detailed circuit diagram of the distortion generator is shown in FIG. 3A. The variable phase shifter 6 has a pair of inductances connected parallel with each other, a first capacitor 6c, a second capacitor 6d, and a varactor diode 6e which is substantially a variable capacitor. The second capacitor 6d and the varactor diode 6e are connected parallel to the first capacitor 6c. And the junction point of the capacitors 6c and 6d is connected to the center tap of the inductance 6b. One end of the second capacitor 6c and one end of the varactor diode 6e are grounded. In that configuration, it should be appreciated that the phase shift in the circuit depends upon the capacitance of the varactor diode 6e, and since the capacitance of the varactor diode 6e depends upon the analog voltage applied to the same, the phase shift can be controlled by the voltage applied to the varactor voltage.

The variable attenuator 7 can adjust the attenuation according to the voltage applied to the same, and that variable attenuator is implimented for instance by "voltage controlled attenuator" type VTF-015 manufactured by AVANTEK Inc. in the U.S.A.

Also, the equalization circuit 14 has a delay line 4 connected parallel to that series circuit with the distortion generator 5, variable attenuator 7 and the variable phase shifter 6, through the power divider 3 and the power combiner 8. The delay time of the signal in the delay line 4 is equal to the delay time in the series circuit of the circuits 5, 6 and 7. That is to say, the delay line 4 provides the original component to the power combiner 8 and the series circuit provides the third order distortion to the power combiner 8, and the delay line 4 compensates the delay time in the series circuit.

FIG. 3A shows the block diagram of the distortion generator which provides the third order distortion. The distortion generator 5 has a 180° hybrid circuit 20 which has the input/output ports A,B,C and D. The port (A) is connected to the input terminal (IN) of the distortion generator 5, and the port (D) is connected to the output terminal (OUT) of the distortion generator 5 through the buffer amplifiers 23. The port (C) is connected to the balancing circuit 21 having a resistor $R_{10}$ and a capacitor $C_{10}$. The port (D) is connected to the distortion circuit 22 which has a pair of transistors $TR_1$ and $TR_2$, a pair of diodes $d_1$ and $d_2$, a plurality of resistors $R_1$ through $R_7$ and a plurality of capacitors $C_1$ through $C_6$.

The input signal applied to the port (A) of the hybrid circuit 20 is divided to two ports (C) and (D), but no signal by that input signal is provided at the port (B) because of the nature of a hybrid circuit. The balancing circuit 21 is a linear circuit, therefore, the balancing circuit 21 provides the output signal which is the reflection of the input signal to the port (C). That is to say, when the input signal to the port (A) is (x), the signal reflected by the balancing circuit 21 and applied to the port (C) is c·x where (c) is a constant. The distortion circuit 22 has the impedance characteristics which is proportional to the third order of the input signal, therefore, the signal reflected by the distortion circuit 22 is $A_1x + A_2x^3$ provided that the input signal is (x). The reflected signal applied to the port (D) is divided to the ports (A) and (B), and the reflected signal applied to the port (C) is divided to the ports (A) and (B). In this case the linear component $A_1x$ from the port (D) and the linear component c·x from the port (C) are cancelled with each other at the port (B). Accordingly, only the third order component $A_2x^3$ is obtained at the port (B). Therefore, it should be appreciated that no linear component is provided at the output port (B), and only the third order component is obtained. That is the important feature of the present distortion generator, and that feature facilitates the separate adjusting of the phase and the amplitude of the distortion component. If a linear component were included in the output of the distortion generator, an adjustment of the phase would affect to the optimum amplitude, and an adjustment of the amplitude would affect to the optimum phase. Therefore, a separate adjustment of the phase and the amplitude would be impossible.

The distortion circuit 22 has a pair of transistors $TR_1$ and $TR_2$ connected parallel with each other. The operational principle of the distortion circuit 22 is to utilize the nature of a semiconductor that the current in a semiconductor diode is substantially proportional to the third order of the input voltage applied to the diode. When the input voltage is small, it is practically true to say that the current is proportional to the third order of the voltage in a diode and/or transistor, although that current changes exactly speaking exponentially following the input voltage.

Figure 3B:
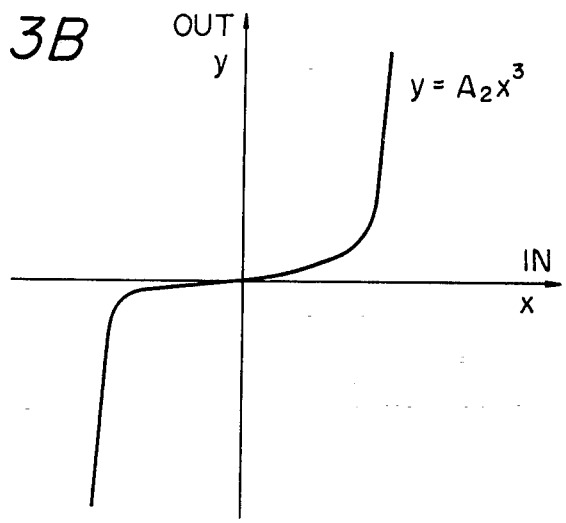
FIG. 3B shows the characteristics of the distortion generator shown in FIG. 3A, FIGS. 4A through 4E show the curves of the characteristics of the present adaptive equalization system.

Accordingly, the distortion generator 5 shown in FIG. 3A provides the characteristics of third order between input voltage and output voltage as shown in FIG. 3B.

(c) Distortion control circuit 13

The distortion control circuit 13 has a monitoring circuit 13a, a memory circuit 13b, a comparator circuit 13c, a logic circuit 13d, switches 13e and 13f, a clock signal generator 13g, and digital analog converters 13h and 13i.

Figure 2C:
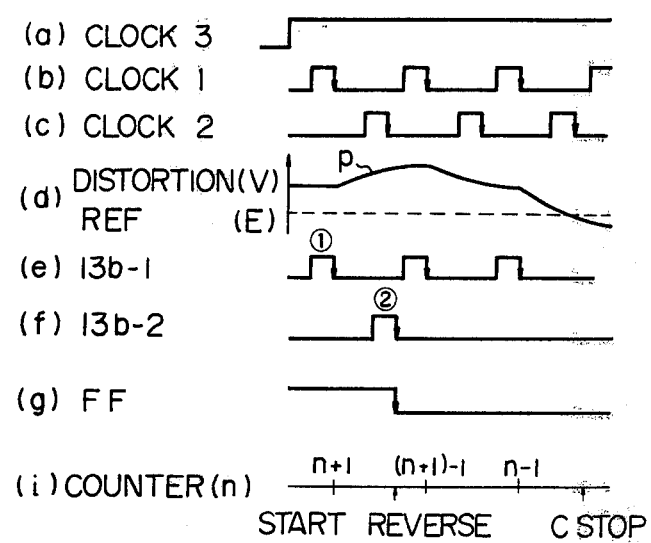
FIG. 2C shows the operational time chart of the apparatus in FIG. 2A.

The clock signal generator 13g generates three clock signals clock(1), clock(2) and clock(3) as shown in FIG. 2C.

The clock(1) and clock(2) are two phase clock signals with the opposite phases or staggered with each other as shown in the curves (b) and (c) in FIG. 2C. The period of the clocks (1) and (2) is preferably 3.2 second, which defines the perturbation period of the distortion control circuit 13. The clock (3) has a longer period than the clocks (1) and (2). The clock(1) is applied to the AND circuit 13a-3 in the monitoring circuit 13a and the first sample hold circuit 13b-1 in the memory circuit 13b. The clock(2) is applied to the second sample hold circuit 13b-2 in the memory circuit 13b, and the clock(3) is applied to the switches 13e and 13f.

It is assumed that the switches 13e and 13f are connected to the contact (a) as shown in FIG. 2A and 2B at the initial condition.

The monitoring circuit 13a has a comparator 13a-2 which compares the reference voltage (E) from the reference voltage generator 13a-1 with the output voltage (V) of the distortion detector 12, and provides the output signal when the distortion voltage (V) exceeds the reference voltage (E) as shown in the curve (d) in FIG. 2C. The output of the comparator 13a-2 is applied to the AND circuit 13a-3 which also receives the clock(1) as a gate signal. The output of the AND circuit 13a-3 is applied to either the up/down counter 13d-3 or the up/down counter 13d-4 through the switch 13e, then, the up/down counter 13d-3 or 13d-4 is incremented or decremented.

On the other hand, the output of the distortion detector 12 is applied to the first and the second sample hold circuits 13b-1 and 13b-2, and the former holds the distortion voltage at the time of the clock(1) and the latter holds the distortion voltage at the timing of the clock(2), as shown in symbols (1) and (2) of the curves (e) and (f) of FIG. 2C. The comparator 13c-1 compares the output $V_n$ of the first sample hold circuit 13b-1 with the output $V_{n+1}$ of the second sample hold circuit 13b-2, and when the former is larger than the latter, the comparator 13c-1 provides the output signal, which is gated by the AND circuit 13c-2 at the timing of the clock (2). The change of the output of the AND circuit 13c-2 is applied to the flip-flop 13d-1 through the switch 13f and the condition of the output of the flip-flop 13d-1 is changed. That is to say, if the previous output of the flip-flop 13d-1 is "high" voltage, then, the output of the flip-flop 13d-1 is changed to "low" voltage as shown in the curve (g) of FIG. 2C. The high voltage of the flip-flop makes the counter an up-counter, and the low voltage of the flip-flop makes the counter a down-counter. That is to say, when the output of the flip-flop is high, the content of the up/down counter is increased by the output pulse from the AND circuit 13a-3 at the timing of the clock (1), while when the output of the flip-flop is low, each output pules of the AND circuit 13a-3 decreases the content of the up/down counter 13d-3. The content of the up/down counter 13d-3 is converted to an analog form by the digital-to-analog converter 13h, which controls the amount of the phase shift in the phase shifter 6.

As described above, the amount of the phase shift is perturbed according to the output of the comparator 13c-1, which reflects the change of the distortion detected by the distortion detector 12. Therefore, by adjusting the phase shifter as mentioned above, the distortion can be reduced sufficiently.

The curve (i) of FIG. 2C shows the change of the content of the up/down counter 13d-3, which the distortion level at the output of the distortion detector 12 changes as shown in the curve (d) of FIG. 2B. At the timing (A), the distortion level exceeds the reference level (E), then, the content of the counter is incremented from (n) to (n+1). However, the distortion is increased by that control as shown by the slope (p) of the curve (d) of FIG. 2C. Therefore, the direction of the control is switched or reversed at the timing (B), and the content of the up/down counter is decreased from (n+1) to ((n+1)−1). At the timing (C), the distortion level becomes lower than the reference level, then the comparator 13a-2 stops, and the control of the phase shifter stops.

Next, when the level of the clock (3) shown in (a) of FIG. 2C changes, the switches 13e and 13f are connected to the contacts (b) and the similar operation is performed with regard to the flip-flop 13d-2, the up/down counter 13d-4 and the digital-to-analog converter 13i, and the variable attenuator 7 is adjusted by the output of the digital-to-analog converter 13i.

When the output of the clock (3) changes again, then, the variable phase shifter 6 is adjusted again. Thus, according to the output of the clock (3), the variable phase shifter and the variable attenuator are adjusted alternately.

All the components in FIGS. 2A and 2B can be implemented by a commercial integrated circuit (IC). For instance, comparators 13c-1 and 13a-2 can be a "general purpose comparator 4082/03" manufactured by Burr-Brown Inc. in the U.S.A., sample hold circuits 13b-1 and 13b-2 can be "SHC23-7350" by Burr-Brown Inc., Flip-flops 13d-1 and 13d-2 can be "SN7473N Dual J-K master-slave flip-flop" manufactured by Texas Instruments Inc. in the U.S.A., up/down counter 13d-3 and 13d-4 can be "SN74191N Synchronous up/down 4 bit binary counter" (single clock line) manufactured by Texas Instruments Inc.

FIGS. 4A through 4E show the curves of the experimental result of the traveling-wave tube amplifier shown in FIG. 2, in which the tested traveling-wave tube is 6W73 manufactured by Nippon Electric Company Limited in Japan.

FIG. 4A shows the curve of the change of the improvement of the nonlinearity distortion (vertical axis) when the ambient temperature (horizontal axis) changes. The curve (a) is the result of the present apparatus shown in FIG. 2, and the curve (b) is the result in the case that only the equalization circuit 14 in FIG. 2 is provided with the non-adaptive situation. That is to say, the curve (b) shows the case that the distortion control circuit 13 does not operate. In FIG. 4A, equalization circuit 14 is adjusted that the nonlinearity distortion at the output terminal 11 is at the minimum when the ambient temperature is 25° C., and it should be appreciated that the distortion of the traveling-wave tube is improved by approximate 35 dB compared with the case that no equalization circuit 14 is utilized. The curve (a) shows that the improvement of the nonlinearity distortion is almost constant when the ambient temperature change in the range from 5° C. to 45° C. However, if an adaptive control by the distortion control circuit 13 does not operate, the distortion characteristics deteriorate as shown in the curve (b).

FIG. 4B shows the curve of the change of the improvement of the nonlinearity distortion (vertical axis) when the voltage (horizontal axis) applied to the helix of a traveling-wave tube changes. The curve (a) which shows the case that the adaptive control by the distortion control ciruict 13 operates, and the curve (a) is almost flat when the helix voltage changes in the range from 3600 volts to 3650 volts. However, the curve (b) which shows the case that no adaptive control is performed shows that the distortion characteristics are deteriorated by the change of the helix voltage.

Figure 4C:
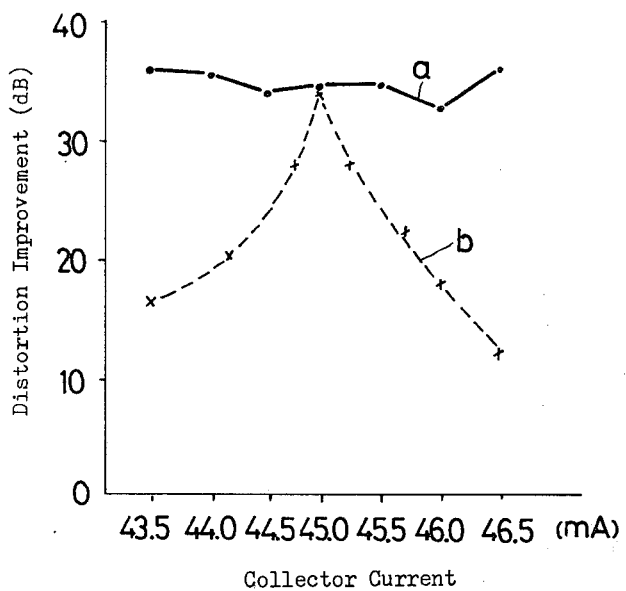

FIG. 4C shows the curves of the change of the improvement of the nonlinearity distortion (vertical axis) when the collector current (horizontal axis) of a traveling-wave tube changes. The curve (a) which shows the case that the adaptive control by the distortion control circuit 13 operates, and the curve (a) is almost flat when the collector current changes in the range from 43.5 mA to 46.5 mA. However, the curve (b) which shows the case that no adaptive control is performed, shows that the distortion characteristics are deteriorated by the change of the collector current.

Figure 4D:
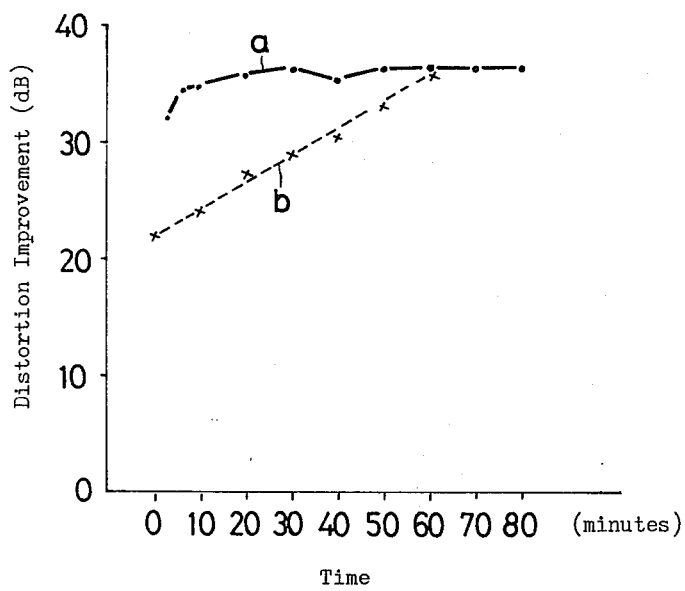

FIG. 4D shows the curves of the change of the improvement of the nonlinearity distortion (vertical axis) when the time (horizontal axis) elapses after turning ON the power switch. The curve (a) which utilizes the present adaptive control shows that the distortion characteristics are excellent, just when the power switch is turned ON. However, the curve (b) which does not utilizes the adaptive control, shows the distortion characteristics are not steady enough until one hour elapses after the power switch is turned ON.

It should be appreciated that the present adaptive equalization system can always provide the improvement of more than 30 dB of the nonlinearity distortion.

Figure 4E:
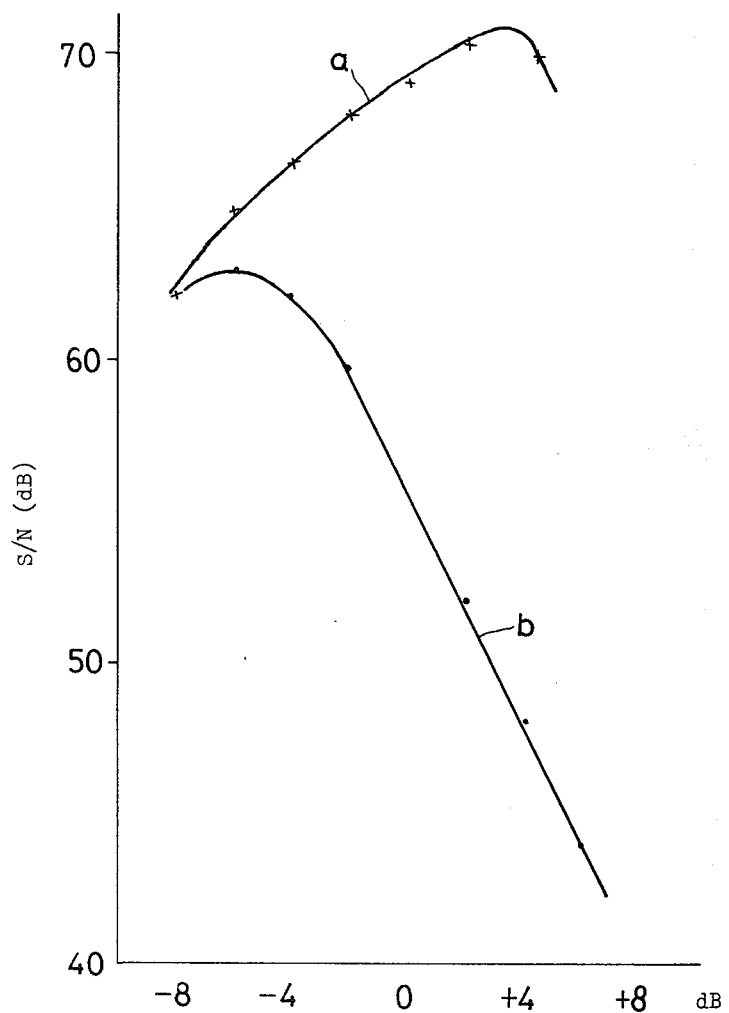

FIG. 4E is the result of the noise loading test, in which the horizontal axis shows the output power of the traveling-wave tube in dB, and the vertical axis shows the measured signal-to-noise ratio (S/N) in dB. In the figure, the Gaussian noise equivalent to 5400 telephone channels is utilized as an input signal, and the nominal output power of the traveling-wave tube is 25 dB (1 mW=0 dB), which is assigned as 0 dB in the horizontal axis. The curve (a) is the case that the present adaptive control is utilized and it should be appreciated that the S/N with the adaptive control is not deteriorated until the output power exceeds 0 dB. The curve (b) is the case that no adaptive control is utilized, and in that case, the S/N is deteriorated when the output power is less than −6 dB. The noise loading test is well known in the art, and is the test in which a Gaussian noise is applied to the input of the apparatus to be tested through a narrow band band-elimination filter, and the signal-to-noise ratio in that narrow band at the output of the apparatus is measured.

Figure 5:
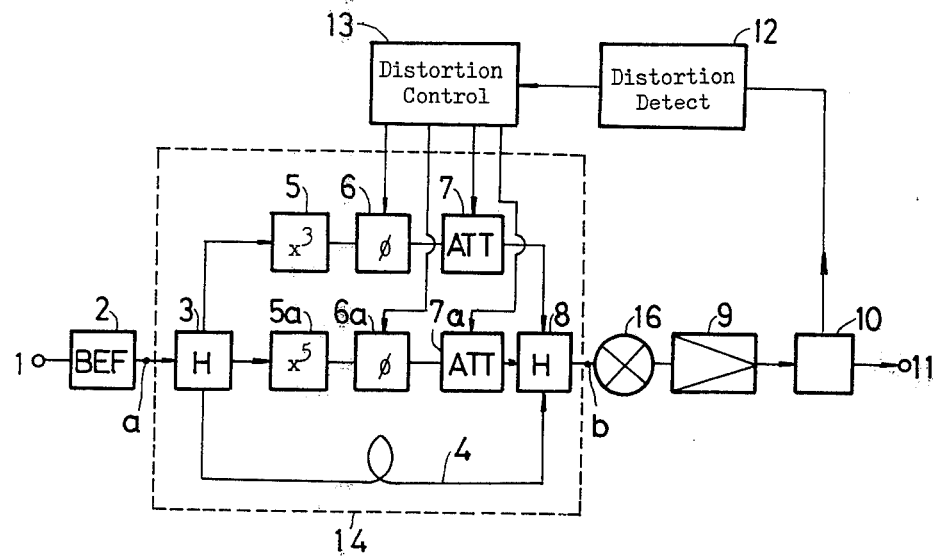
FIG. 5 is the block diagram of another embodiment of the present adaptive equalization system.

FIG. 5 shows the block diagram of other embodiment of the present invention, and the same reference numerals as those in FIG. 1 show the same members as those in FIG. 1. The feature of the embodiment in FIG. 5 is the presence of the second distortion generator 5a, the second variable phase shifter 6a and the second variable attenuator 7a. The second distortion generator 5a provides the 5'th order distortion, and the phase and the amplitude of that 5'th order distortion are adjusted by the phase shifter 6a and the attenuator 7a, respectively. The output of the second attenuator 7a is combined to the output of the delay line 4 and the output of the first attenuator 7 which provides the controlled 3'rd distortion in the power combiner 8. The embodiment in FIG. 5 can compensate not only the 3'rd distortion but also the 5'th distortion, therefore, the resultant output distortion is further reduced.

Figure 6:
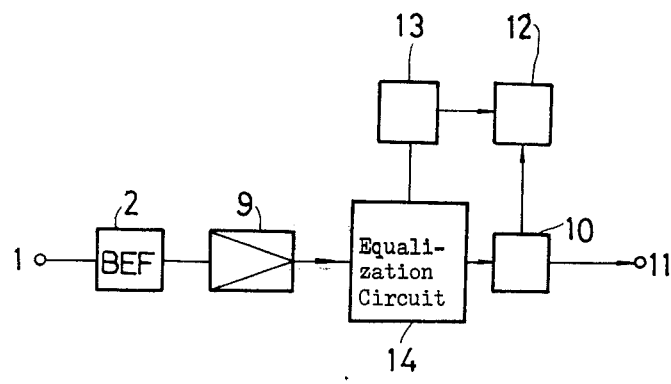
FIG. 6 is the block diagram of another embodiment of the present adaptive equalization system.

FIG. 6 shows the block diagram of still other embodiment of the present invention. The feature of the embodiment in FIG. 6 is that the equalization circuit 14 is at the output side of the circuit 9 to be equalized, while the equalization circuit 14 in the embodiment in FIG. 1 is at the input side of the circuit 9 to be equalized.

Figure 7:
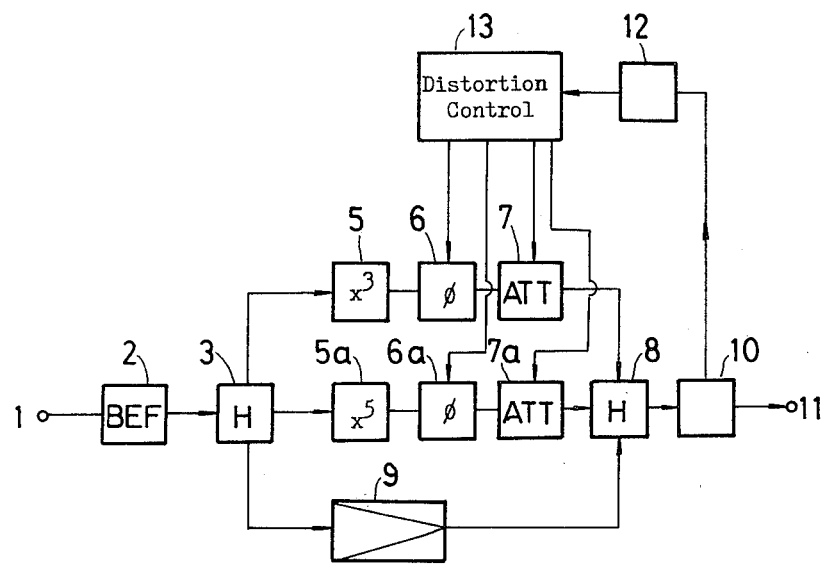
FIG. 7 is the block diagram of still another embodiment of the present adaptive equalization system.

FIG. 7 shows the block diagram of still other embodiment of the present invention. The feature of the embodiment in FIG. 7 is that the equalization circuit having the distortion generator 5, the variable phase attenuator 6 and the variable attenuator 7 is connected parallel to the circuit 9 to be equalized. The embodiment of FIG. 7 has the second distortion generator 5a which provides the 5'th order distortion and the relating variable phase generator 6 and the variable attenuator 7. Those circuits are also connected parallel to the circuit 9 to be equalized.

It should be appreciated of course that the present invention is not restricted to the odd'th order distortion like 3'rd order distortion and/or 5'th order distortion, but the present invention can compensate the even'th order distortion like 2'nd order distortion and/or 4'th order distortion, by merely substituting the distortion generator 5 or 5a to an even'th order distortion generator.

Now, other embodiments will be described in accordance with FIGS. 8 through 9.

The embodiments described before in accordance with FIGS. 1 through 7 have the assumption that the input signal is equivalent to the Gaussian noise which has the constant average level. That assumption is true so far as the conventional tone idle telephone system is concerned.

However, when a common signal control system which is to be spreaded in future is utilized, the average level of the multiplexed wideband telephone channel is not constant but changes. That common signal control system utilizes a common channel which is occupied only for the transmission of the tone or control signal of the plurality of speech channels. The No. 6 system recommended by (International Telegraph and Telephone Consultative Committee which is one of the subsidiary organization on the United Nations) C.C.I.T.T. is one of that common signal control system.

Figure 8:
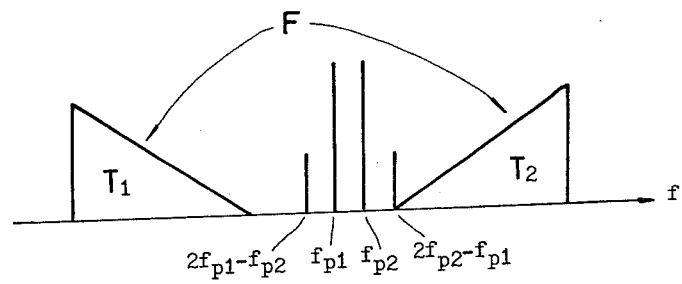
FIG. 8 is the explanatory drawing of the operation of the still another embodiment of the present adaptive equalization system.
Figure 9:
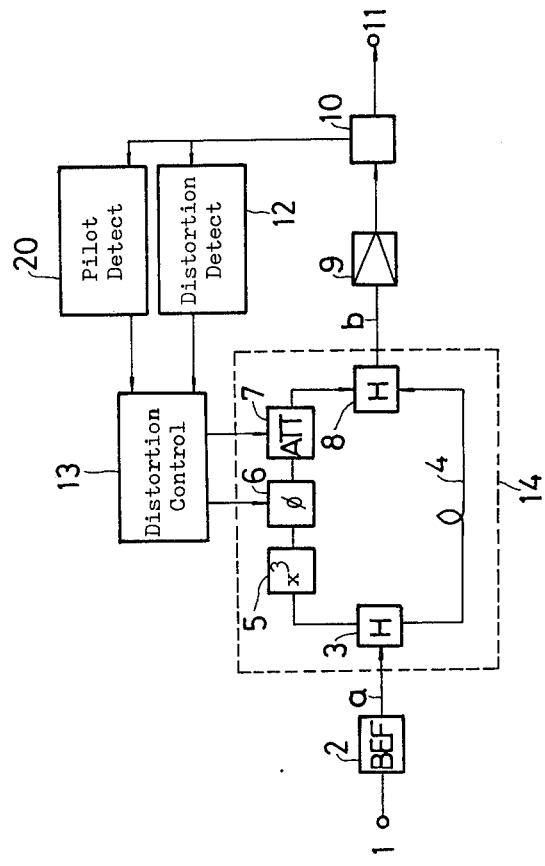
FIG. 9 is the block diagram of the embodiment of the present equalization system relating to FIG. 8.

In order to solve the problem of the change of the signal level, the embodiment in FIGS. 8 through 9 utilizes a pair of pilot signal the level of which is constant. The pilot signals are inserted in the signal to be equalized beforehand, and the frequencies of the pilot signals are $f_{p1}$ and $f_{p2}$. When the signal to be equalized is distorted, the pilot signals are also distorted and the distortion component is generated. When the 3'rd order distortion concerns, the frequency of the distortion component is $2f_{p2}-f_{p1}$, or $2f_{p1}-f_{p2}$. The signal allocation is designed so that those pilot signals and their distortion components are positioned in the idle channel or the gap channel in the spectrum as shown in FIG. 9. In FIG. 9, $f_{p1}$ and $f_{p2}$ are pilot signals of the definite level inserted in the signal beforehand, $2f_{p1}-f_{p2}$ and $2f_{p2}-f_{p1}$ are 3'rd order distortion components generated from those pilot signals, $T_1$ and $T_2$ are effective speech channels, and (ID) shows the idle channel where no effective telephone channel exists.

FIG. 9 is the block diagram of the embodiment for handling the pilot signals. The features of the apparatus in FIG. 9 compared with the embodiment in FIG. 1 are that the center frequency of the band-elimination filter 2 is designed to be either $2f_{p1}-f_{p2}$, or $2f_{p2}-f_{p1}$, and the presence of the pilot signal detector 20. In FIG. 9, the signal having the pilot signals of the constant level is applied to the band-elimination filter 2 which deletes one of the 3'rd order distortion components. The output of the band-elimination filter 2 is divided to two paths, one of them is pre-distorted by the distortion generator 5, and the other is applied to the power combiner 8. As mentioned before in accordance with FIG. 1, the phase of the amplitude of the distortion are adjusted by the variable phase shifter 6 and the variable attenuator 7. The combined signal at the output of the power combiner 8 is applied to the circuit 9 to be equalized. In an ideal situation, the distortion by the distortion generator 5 is completely cancelled by the distortion of the circuit 9. If there is a residual distortion, that distortion is detected by the distortion detector 12, and the distortion control circuit 13 controls the variable phase shifter 6 and the variable attenuator 7 so that the residual distortion detected by the distortion detector 12 becomes minimum.

The insertion of the pilot signals in the circuit is performed in one of the following three modes.

(a) The pilot signals are always inserted in the idle channel of the circuit.

(b) The pilot signals are inserted in the idle channel of the circuit only when the equalization operation is performed.

(c) The pilot signals are inserted in the idle channel of the circuit of a stand-by apparatus, when there are a plurality of wireless communication apparatuses operating simultaneously, and one of them is an active stand-by apparatus. In this case, all the apparatuses can be equalized by switching the stand-by apparatus one after another.

When the pilot signals are utilized for the equalization, the pilot signals must be detected for initializing the equalization operation. The pilot signal detector 20 in FIG. 9 connected to the output of the circuit 9 through the power divider 10 is utilized for that purpose, and upon detection of the pilot signals, the pilot detector 14 initializes and starts the operation of the equalization system in FIG. 9.

As mentioned above in detail, according to the present invention, the distortion generated in an amplifier or a circuit can be automatically and adaptively compensated. Therefore, the change of the characteristics of the circuit due to the change of the ambient temperature, the power supply, the secular variation is conveniently compensated, and the nonlinearity distortion of an amplifier and/or a frequency converter is effectively reduced and compensated. Further, the initial adjustment operation for obtaining the desirable characteristics can be removed, since the present invention provides the automatic and adaptive compensation.

Further, it should be appreciated that the present equalization system does not utilize a conventional negative feedback loop, but the present invention depends upon a so-called feedforward control. Therefore, the present invention can follow the very rapid changes involved, and provide a quicker response as compared with a conventional negative feedback system.

From the foregoing it will now be apparent that a new and improved adaptive nonlinearity equalization system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An adaptive equalization system for nonlinearities comprising, (a) an input terminal receiving an input signal, an output terminal providing an equalized output signal, and a circuit to be equalized inserted between the input terminal and the output terminal,
(b) an equalization circuit connected in series with that circuit to be equalized, having a series circuit with a distortion generator for providing the high order distortion, a variable phase shifter for shifting the phase of the output signal of said distortion generator and a variable attenuator for adjusting the amplitude of the output signal of the distortion generator, and a delay means connected parallel to that series circuit so that the delay time in that delay means is equal to the delay time in said series circuit,
(c) a distortion detector connected to the output terminal of the adaptive equalization system for detecting the noise level in the predetermined narrow frequency band, and
(d) a distortion control circuit connected to the output of said distortion detector for controlling said variable phase shifter and said variable attenuator so that the distortion detected by said distortion detector becomes minimum.

2. An adaptive equalization system for nonlinearities according to claim 1, wherein said circuit to be equalized is a traveling-wave tube amplifier, 3. An adaptive equalization system for nonlinearities according to claim 1, wherein said distortion control circuit operates only when the distortion level detected by the distortion detector exceeds the predetermined level.

4. An adaptive equalization system for nonlinearities according to claim 1, wherein said distortion generator provides the third order distortion.

5. An adaptive equalization system for nonlinearities according to claim 1, wherein a pair of pilot signals are inserted in the input signal, and the distortion detector detects the intermodulation distortion by said pilot signals.

6. An adaptive equalization system for nonlinearities according to claim 1, wherein a band-elimination filter is inserted between the input terminal and the equalization circuit.

7. An adaptive equalization system for nonlinearities according to claim 1, wherein another series circuit having the distortion generator providing the 5'th order distortion, a variable phase shifter for shifting the phase of the output of said distortion generator; and a variable attenuator for adjusting the amplitude of the output of said distortion generator is connected parallel to said delay means.

8. An adaptive equalization system for nonlinearities according to claim 1, wherein said equalization circuit is connected to the input side of the circuit to be equalized.

9. An adaptive equalization system for nonlinearities according to claim 1, wherein said equalization circuit is connected to the output side of the circuit to be equalized.

* * * * *